United States Patent [19]

Knight

[11] Patent Number: 4,533,889
[45] Date of Patent: Aug. 6, 1985

[54] RELAYS AND METHOD FOR MOUNTING RELAYS ON PRINTED CIRCUIT BOARDS

[75] Inventor: Michael W. Knight, Fort Branch, Ind.

[73] Assignee: AMF Incorporated, White Plains, N.Y.

[21] Appl. No.: 560,903

[22] Filed: Dec. 14, 1983

[51] Int. Cl.³ .......................................... H01H 47/04
[52] U.S. Cl. ................................. 335/199; 361/400; 339/17 A; 29/622
[58] Field of Search ..................... 335/199; 200/5 A; 361/400, 404, 405; 339/17 A; 29/622

[56] References Cited

U.S. PATENT DOCUMENTS

| | | | |
|---|---|---|---|
| Re. 26,837 | 3/1970 | Evans | 317/101 |
| 3,121,147 | 2/1964 | dal Bianco | 200/87 |
| 3,396,313 | 8/1968 | Payne | 317/101 |
| 3,501,719 | 3/1970 | Richert | 335/106 |
| 3,517,273 | 6/1970 | Bentley et al. | 317/101 |
| 3,525,067 | 8/1970 | Bang | 339/17 |
| 3,717,829 | 2/1973 | Flaherty | 335/187 |
| 3,763,448 | 10/1973 | Walters | 335/199 |
| 3,893,194 | 7/1975 | Hayden et al. | 335/202 |
| 3,899,719 | 8/1974 | Murphy | 317/101 |
| 4,003,617 | 1/1977 | Witek, Jr. et al. | 339/17 C |
| 4,017,143 | 4/1977 | Knowles | 339/221 |
| 4,045,752 | 8/1977 | Frigo | 335/202 |
| 4,223,370 | 9/1980 | Quere | 361/331 |
| 4,400,761 | 8/1983 | Hayden et al. | 361/400 |

Primary Examiner—E. A. Goldberg
Assistant Examiner—George Andrews
Attorney, Agent, or Firm—David E. Dougherty; Thomas J. Durling

[57] ABSTRACT

A relay adapted to be mounted on a printed circuit board, and a method for mounting such relays. The relay includes the usual terminals (23, 24, 26 27, 28, 29) extending therefrom and adapted to be mounted on a printed circuit board (30) and electrically coupled to conducting paths on the board. In addition, however, the relay is provided with additional load terminals (56, 59, 62, 82, 92) which function as external connection junctions to connect the relay directly to the load being controlled via a circuit that completely bypasses the printed circuit board. According to a preferred embodiment, the relay includes stationary contact members formed to have not only board-mounted terminal portions extending therefrom but also external terminal portions for direct attachment to the load.

By retaining the original load terminals on the relay and mounting them to the printed circuit board, added support is provided to help prevent dislocation of the relay from the board when the relay is connected to or disconnected from the load. These board-mounted load terminals can also be used for logic-sensing purposes or the like. Preferably, at least the stationary contact members are formed with an additonal pin portion (63, 64) also adapted to be attached to the board for additional support.

The invention permits the use of less costly board material, more efficient utilization of board space, and, in general, a more reliably operating switching circuit.

23 Claims, 7 Drawing Figures

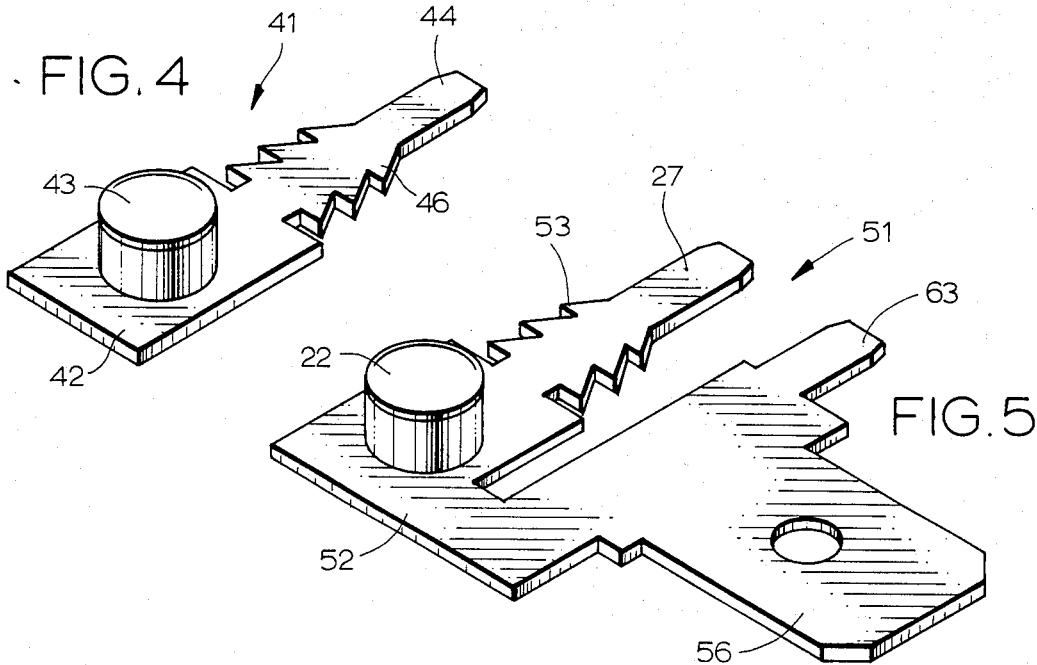
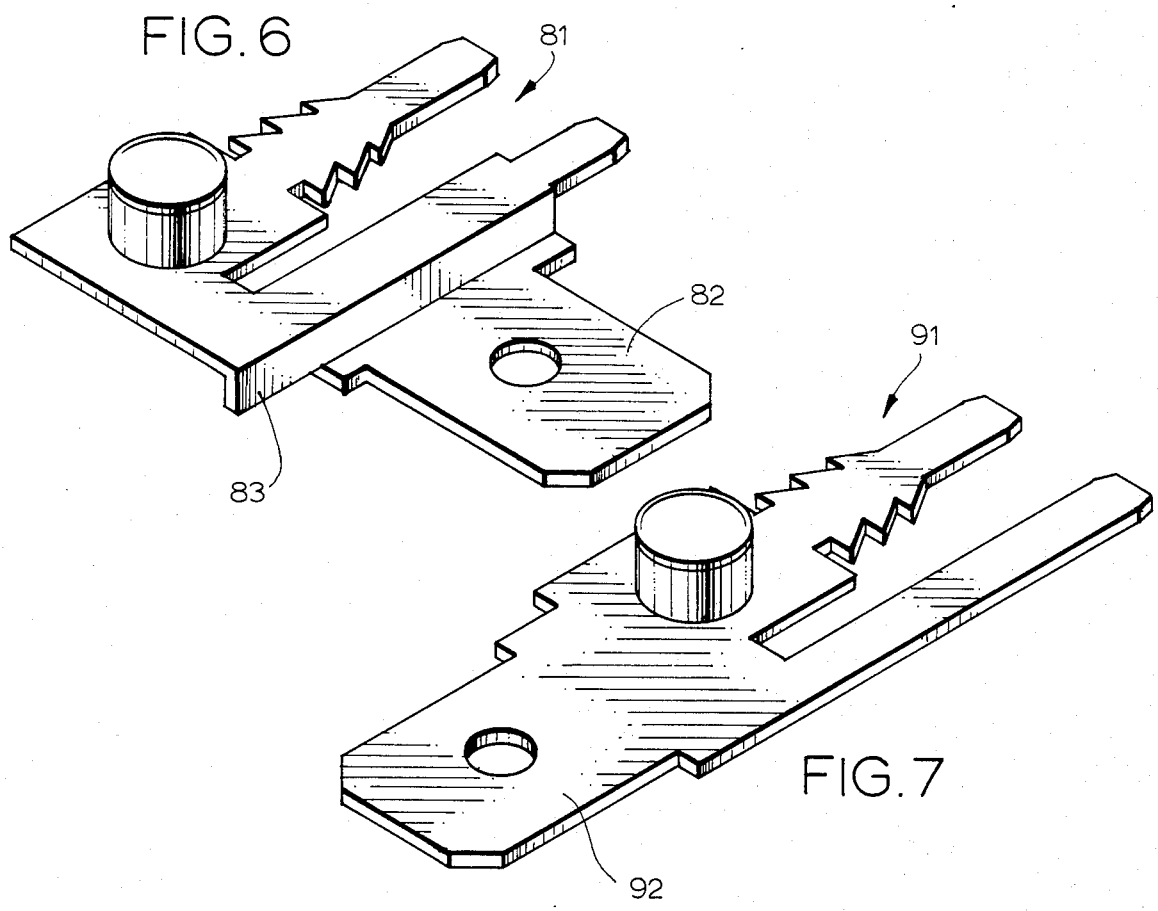

4,533,889

RELAYS AND METHOD FOR MOUNTING RELAYS ON PRINTED CIRCUIT BOARDS

TECHNICAL FIELD

The present invention relates to relays which are designed to be mounted on printed circuit boards, as well as to an improved method for mounting relays on such boards.

BACKGROUND ART

Commonly assigned, co-pending U.S. patent application Ser. No. 546,860 of Michael W. Knight and Paul G. Feil filed on Oct. 31, 1983, and entitled Miniature Power Switching Relay and Method of Manufacture describes a single-pole, power-switching relay that was designed to be mounted and terminated on a printed circuit board. As is typical of such relays, all terminals and connections are electrically coupled to conducting paths on the board itself; and all external load power connections are adapted to be made to terminals installed on the board and electrically coupled to the external ends of the conducting paths.

There are a number of disadvantages to this type of mounting procedure. Initially, relays of the type described in the above-identified application are relatively high-current devices (up to 30 amps at 240 volts AC) and thus require relatively thick, wide conducting paths on the printed circuit board capable of accommodating these loads. These necessitate the use of significant amounts of copper to form the paths and also occupy valuable board space which could often be better utilized for other purposes. Frequently also, high loads require the use of costly two-sided boards having conductive paths on both sides of the board.

In addition, this mounting procedure requires at least three separate electrical connections for each line: a first connection coupling the relay terminal to the printed circuit board (for example, a solder connection); a second connector attaching a termination element to the external end of the conducting path on the board (for example, a rivet and/or solder); and a third connector coupling the termination element to the external load (for example, a quick-connect coupler). Since the number of connections increases the chances of interface problems, especially at higher current levels, it would be advantageous to be able to reduce the number of connections.

DISCLOSURE OF THE INVENTION

In accordance with the present invention, a relay construction is provided which obviates the disadvantages described above. In particular, the relay according to the present invention is designed to have load terminals that function as external connection junctions such that the external load power connections can be made directly to the relay rather than through conducting paths on the printed circuit board. By bypassing the printed circuit board in this way, the number of connections in the switching circuit is reduced, thus increasing the reliability of the circuit. Also, because it is no longer necessary for the board to carry high load currents, it becomes possible to use thinner, less costly printed circuit boards as well as thinner and narrower conductive paths which require lesser amounts of copper and, in general, to utilize available board space more efficiently.

According to a presently preferred embodiment of the invention, the stationary contact members of the relay are designed to have external terminal portions which extend from the relay body in a different direction from that of the board-mounted terminal portions thereof and these external terminal portions, together with an external common terminal mounted to the relay frame, provide an external switching circuit that completely bypasses the printed circuit board.

Preferably, the external terminal portions comprise the male portions of a male-female, quick-connect coupler such that the load to be controlled can quickly and easily be connected to or disconnected from the relay without placing undue stress on the relay/printed circuit board assembly. They could comprise other types of connection elements as well, if desired.

One feature of the present invention is that all the board-mounted terminals have been retained in the relay including the power-switching terminals. This permits the terminals to be used for logic sensing and other purposes and provides additional mechanical strength to help prevent any dislocation of the relay relative to the printed circuit board. For even more support, however, the stationary contact members according to a presently preferred embodiment have been provided with an additional mounting pin portion which is adapted to be attached to the printed circuit board.

Further advantages and objects of the invention will become apparent during the following description of the best modes for carrying out the invention taken in conjunction with the drawings.

BRIEF DESCRIPTIONS OF THE DRAWINGS

FIG. 1 schematically illustrates a relay according to a presently preferred embodiment of the invention;

FIG. 4 illustrates a stationary contact member as is incorporated in the relay described in the above-identified co-pending U.S. patent application Ser. No. 546,860 of Knight and Feil;

FIG. 5 illustrates the stationary contact member according to a preferred embodiment of the present invention, and as is incorporated into the relay of FIGS. 1–3; and FIGS. 6 and 7 illustrate alternative embodiments of the invention.

BEST MODES FOR CARRYING OUT THE INVENTION

Figure 1:
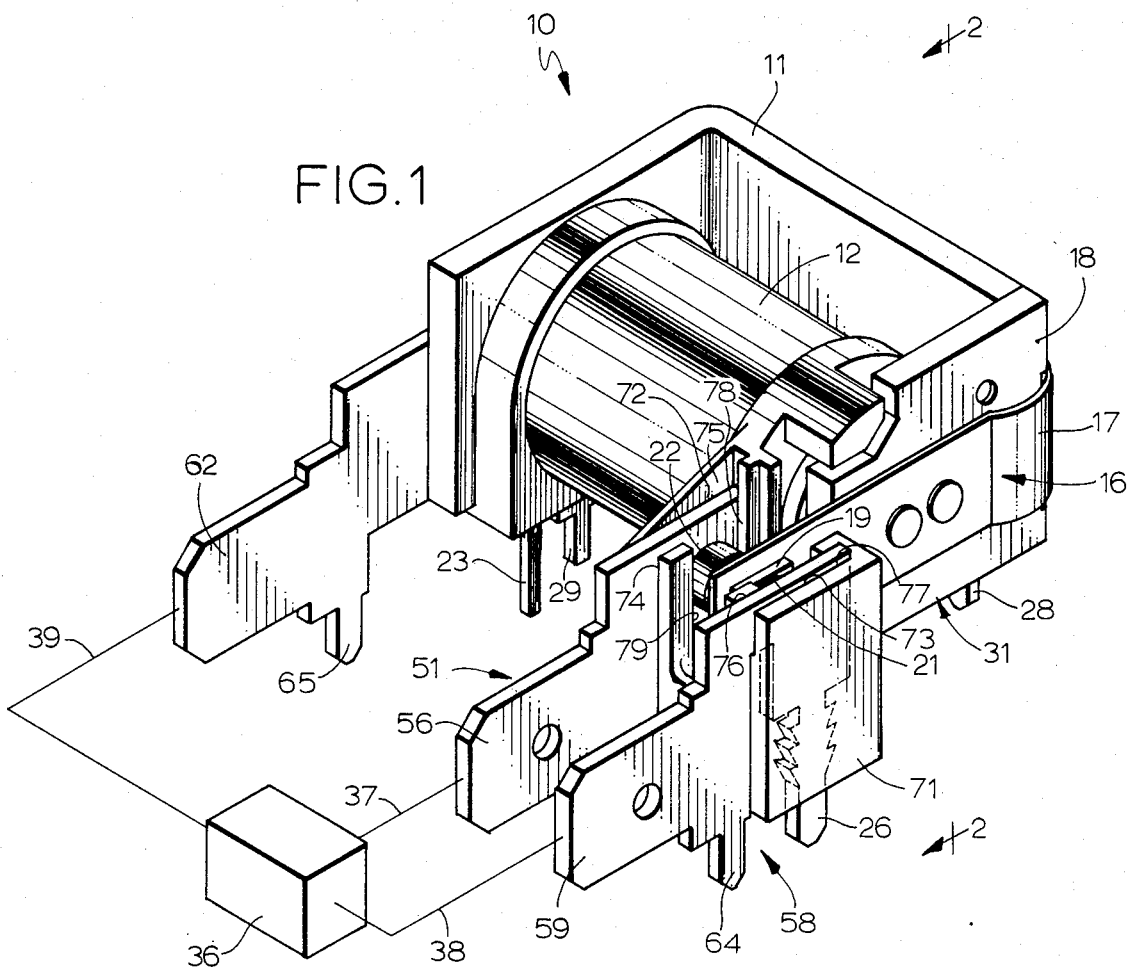
Figure 3:
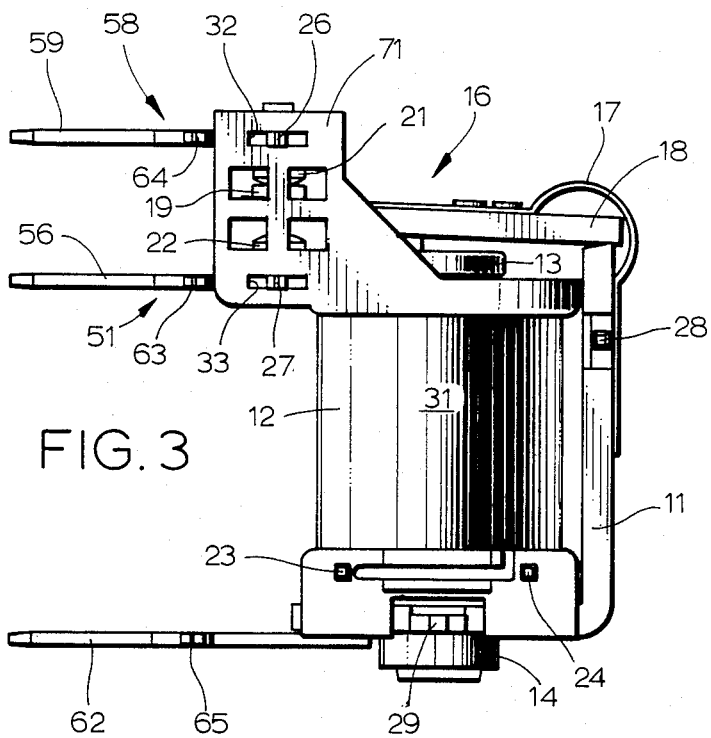
FIG. 3 illustrates a view of the bottom of the relay of FIG. 1 looking in the direction of arrow 3—3 in FIG. 2.
Figure 2:
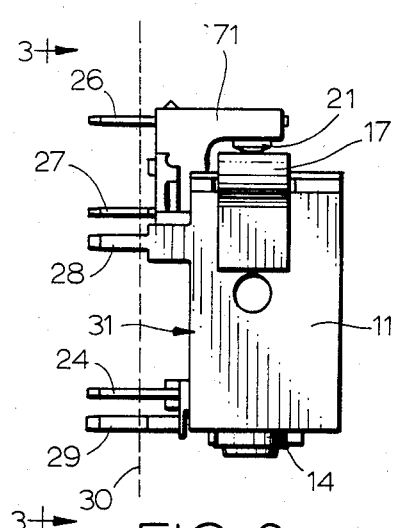
FIG. 2 illustrates a back view of the relay of FIG. 1, looking in the direction of arrows 2—2 in FIG. 1 with the relay being turned by 90° relative to the view of FIG. 1.

FIGS. 1 through 3 illustrate a relay in accordance with a presently preferred embodiment of the invention. Much of the relay structure will not be described in detail herein because it is not pertinent to the present invention, and also because it has, for the most part, been described fully in the above-identified, co-pending U.S. patent application Ser. No. 546,860 of Knight and Feil.

The relay is generally designated by reference number 10 and includes a frame 11, a coil assembly 12, and a core 13 extending through the coil assembly and attached to the base of the frame at 14. The relay further includes a movable contact arm spring assembly 16 which includes a spring 17 supporting an armature 18 and a movable contact button 19.

Spring 17 will normally bias movable contact button 19 against normally closed, stationary contact button 21; however, when the coil is energized, the then magnetized core will pull the armature 18 toward the core and carry movable contact button 19 away from contact button 21 and against normally open, stationary contact button 22. When the coil 12 is deenergized, the armature will be released by the core, and the spring 17 will carry button 19 back against stationary contact button 21.

As shown in the FIGS., the relay is provided with a number of terminals. For example, a pair of coil terminals 23 and 24 is provided to connect the coil 12 to an appropriate means for energizing the coil. In addition, terminals 26 and 27 are electrically coupled to stationary contact buttons 21 and 22. Finally, terminals 28 and 29 are integral with and extend from frame 11 as illustrated and function as common terminals. All six of the above-identified terminals extend from the face 31 of the relay shown best in FIG. 3 and are adapted to be mounted to a printed circuit board (schematically illustrated by dotted line 30 in FIG. 2) as by being soldered or otherwise directly electrically coupled to conducting paths on the board, or by being plugged into a socket affixed to the board.

In the relay described in the above-mentioned copending U.S. patent application Ser. No. 546,860 to Knight and Feil, connection of the relay to an external load being controlled is made through conducting paths on the printed circuit board connecting the load terminals to connection junctions mounted on the external ends of the conducting paths for connection to the external load. However, as was pointed out above, there are several disadvantages to this approach. For example, as indicated previously, heavy conducting paths requiring significant amounts of copper and occupying considerable board space are needed to accommodate the relatively high currents that are capable of being switched by the relay.

The present invention overcomes these disadvantages by designing the stationary contact members to have, in addition to printed circuit board-mounted terminal portions, external terminal portions through which external load power connections can be made directly to the relay rather than through conducting paths on the printed circuit board. These external terminal portions, along with an appropriately oriented external terminal coupled to the relay frame to function as an external common terminal, provide an external switching circuit that completely bypasses the printed circuit board.

FIG. 4 illustrates a normally open stationary contact member 41 of the type that is utilized in the relay described in the above-identified U.S. patent application Ser. No. 546,860 of Knight and Feil. This member comprises a generally flat, rectangular plate portion 42 supporting a contact button 43 and having an extended terminal portion 44 adapted to extend out from the relay and be plugged into a printed circuit board. The extended terminal portion 44 is adapted to extend through a slot in the relay (see, for example, slot 33 in FIG. 3) and is provided with a plurality of barbs 46 to grab the walls of the slot to help retain the contact member properly positioned in the relay.

FIG. 5 illustrates the normally open stationary contact terminal member 51 according to a preferred embodiment of the present invention. As shown, the member includes a flat, generally rectangular portion 52 to which the contact button 22 is attached as by staking or the like, and an extended terminal portion 27 which is adapted to extend through a slot 33 in the relay as is illustrated in FIG. 3. Terminal portion 27 is provided with a plurality of barbs 53 adapted to grab the sidewalls of slot 33 to help retain the contact member firmly in position in the relay.

The member 51 of FIG. 5 differs from the member 41 of FIG. 4 in that member 51 is additionally provided with an external terminal portion 56 which extends from the relay in a direction that is substantially perpendicular to the direction of terminal portion 27 (see FIGS. 1 and 3). Portion 56 is flat and somewhat rectangular-shaped, and is preferably formed integral with member 51 such that terminal portions 27 and 56 are of integral, one-piece construction.

Although not illustrated in detail, normally closed contact member 58 is similar in construction to member 51 and includes a board-mounted terminal portion 26 adapted to extend through a slot 32 in the relay (FIG. 3), and an external terminal portion 59 extending from the member at a right angle to terminal portion 26.

As shown in FIGS. 1 and 3, an external terminal 62 in the shape of a flat, elongated plate is welded or otherwise attached to the frame 11 of the relay to function as a common external terminal.

External terminals 56, 59, and 62 each comprise the male portion of a male-female quick-connect coupler for convenient, direct coupling of the relay to an external load 36 via paths 37, 38, and 39, respectively, which completely bypass the printed circuit board 30 (see FIG. 1). As can, perhaps, best be seen in FIG. 1, the external terminals are designed so that they will extend from the relay in a direction that is substantially parallel to the printed circuit board and be as close to the board as is reasonably possible. This helps to reduce the stresses on the board when the terminals are connected to or disconnected from the external load and permits the use of thinner, less costly boards. In the presently preferred embodiment, the spacing between the board and the terminals are about 0.159 cm which has been found to be sufficient to permit easy connection of the female coupler to the male terminals.

As mentioned previously, even though terminal portions 26 and 27 of the stationary contact members, as well as common terminals 28 and 29, are no longer used as load terminals, it is still preferred that they be retained on the relay and be mounted to the printed circuit board. This provides added strength to the relay/printed circuit board connection and, in addition, permits the terminals to be used for logic-sensing or other purposes.

For additional strength in withstanding the stresses of connecting and disconnecting the relay from the load, however, it is preferred to provide additional support for the relay. With reference especially to FIG. 5, it can be seen that this has conveniently been accomplished by forming, integral with contact member 51, an additional pin portion 63 which extends in the same direction as terminal portion 27 and is adapted to be secured to the printed circuit board in any desirable manner such as by soldering or the like.

In a similar fashion, contact member 58 and preferably also external terminal portion 62 are provided with pin portions 64 and 65, respectively, which are likewise adapted to be mounted to the printed circuit board.

Pin portions 63, 64, and 65 are primarily provided to help maintain the relay securely in position on the printed circuit board and to counteract forces that would tend to pull the relay away from the board. Means are also provided to protect the relay against forces applied to external terminal portions 56 and 59 during connection and disconnection of an external load that would tend to bend them closer together or farther apart. This is important because the stationary contact buttons 21 and 22 must be maintained correctly positioned with respect to one another and with respect to movable contact 19 at all times for proper relay operation and because terminal portions 56 and 59 are integral with the stationary contact members; any squeezing together or pulling apart of the terminal portions could cause a similar result to the contact buttons.

Specifically, with reference to FIG. 1, the stationary terminal members 51 and 58 are supported within a support structure 71 that preferably is formed integral with the bobbin of the coil assembly 12. This support structure defines a pair of slots 72 and 73 within which the terminal members 51 and 58, respectively, are supported and from which the external terminal portions 56 and 59 extend as shown. Slot 72 is defined by inner and outer walls 74 and 75 while slot 73 is defined by inner and outer walls 76 and 77. The inner walls of each slot are cut away to define openings 78 and 79 through which the stationary contacts 22 and 21, respectively, extend.

The terminal members 51 and 58 fit tightly within the slots 72 and 73, and these slots prevent any movement of the contacts 22 and 21, respectively, toward or away from one another. Accordingly, any forces that would tend to bend the terminal portions 56 and 59 closer together or farther apart will not be able to cause any displacement of the contacts; and the correct positioning of these elements is assured.

FIG. 6 illustrates an alternative embodiment of the invention. FIG. 6 differs from FIG. 5 in that external load terminal 82 is joined to the contact member 81 with an L-shaped bend 83 to further strengthen the member. This L-shaped bend is not believed to be necessary in most applications, but could be provided, if desired, for increased protection.

FIG. 7 illustrates a further alternative embodiment where the external load terminal 92 of contact member 91 is oriented to extend in a direction vertical to the printed circuit board rather than parallel to it as in the previous embodiments.

While what has been described constitutes presently most preferred embodiments, it should be recognized that the invention could take many other forms and that many changes can be made without departing from the spirit and scope of the invention and without diminishing its intended advantages. For example, external load terminals 56, 59, and 62 could comprise any one of many terminal types that are known in the art and could be connected to the load in any one of a myriad of ways. Also, it is not intended to restrict the invention to the particular relay design described herein. The invention could be practiced with other types of relays as well as with other types of electrical components adapted to be mounted on printed circuit boards. Because the invention can take many other forms, it is intended that all such changes and modifications be covered by the following claims.

I claim:

1. A relay adapted to be mounted on a printed circuit board, said relay including stationary contact means having first terminal means associated therewith, movable contact means having second terminal means associated therewith, and means for moving said movable contact means relative to said stationary contact means to operate said relay, characterized in that said first terminal means includes board-mounted first terminal means (26, 27) for mounting said relay on a printed circuit board (30) and for electrically connecting said stationary contact means (51, 58, 81, 91) to conducting paths on said printed circuit board (30), and external first terminal means (56, 59, 82, 92) for directly electrically connecting said stationary contact means (51, 58, 81, 91) to a load (36) external of and bypassing any conducting paths on said printed circuit board (30), and wherein said second terminal means includes board-mounted second terminal means (28, 29) for mounting said relay on a printed circuit board (30) and for electrically connecting said movable contact means (19) to conductive paths on said printed circuit board (30), and external second terminal means (62) for directly electrically connecting said movable contact means (19) to a load (36) external of and bypassing any conducting paths on said printed circuit board (30).

2. A relay as recited in claim 1 wherein said board-mounted first terminal means (26, 27) and said external first terminal means (56, 59, 82, 92) extend from said relay in different directions.

3. A relay as recited in claim 2 wherein said external first terminal means (56, 59, 82) extends from said relay in a direction that is substantially perpendicular to said board-mounted first terminal means (26, 27).

4. A relay as recited in claim 2 wherein said external first terminal means (92) extends from said relay in a direction that is substantially opposite to that of said board-mounted first terminal means (26, 27).

5. A relay as recited in claim 1 wherein said board-mounted first terminal means (26, 27) and said external first terminal means (56, 59, 82, 92) are of integral, one-piece construction.

6. A relay as recited in claim 1 wherein said external first terminal means (56, 59, 82, 92) and said external second terminal means (62) comprise quick-connect couplers.

7. A relay as recited in claim 1 wherein said stationary contact means (51, 58, 81, 91) comprises a stationary contact-supporting portion (52) supporting stationary contacts (21, 22), and wherein said board-mounted first terminal means comprises a board-mounted first terminal portion (26, 27) extending from said stationary contact supporting portion, and said external first terminal means comprises an external first terminal portion (56, 59, 82, 92) extending from said stationary contact supporting portion.

8. A relay as recited in claim 7 wherein said stationary contact-supporting portion (52), said board-mounted first terminal portion (26, 27), and said external first terminal portion (56, 59, 82, 92) are of integral, one-piece construction.

9. A relay as recited in claim 8 wherein said external first terminal portion (82) extends from said stationary contact-supporting portion (52) with an L-shaped bend (83) therebetween for added strength.

10. A relay as recited in claim 8 wherein said stationary contact-supporting portion (52) further includes an integral pin portion (63, 64) extending therefrom for being attached to a printed circuit board (30) for additionally supporting said relay on said printed circuit board.

11. A relay as recited in claim 10 wherein said external second terminal means (62) further includes an integral pin portion (65) extending therefrom for being attached to said printed circuit board (30) for additionally supporting said relay on said printed circuit board (30).

12. A relay as recited in claim 10 wherein said board-mounted first terminal portion (26, 27) and said pin portion (63, 64) extend in a first direction and wherein said external first terminal portion (56, 59, 82, 92) extends in a second direction different from said first direction.

13. A relay as recited in claim 12 wherein said external first terminal portion (56, 59, 82, 92) comprises a quick-connect coupler.

14. A relay as recited in claim 13 wherein said external second terminal means (62) comprises a quick-connect coupler attached to the frame (11) of said relay and extending from said relay in said second direction.

15. A relay as recited in claim 8 and further including means (71) for supporting said stationary contact means, said supporting means including slot means (72, 73) for receiving said stationary contact means (51, 58, 81, 91) and for maintaining said stationary contacts (21, 22) in position in said relay.

16. A relay adapted to be mounted on a printed circuit board including first and second stationary contact members, a movable contact member, and means for moving said movable contact member between said first and second stationary contact members for operating said relay, characterized in that said first and second stationary contact members (51, 58, 81, 91) each include a board-mounted terminal portion (26, 27) electrically coupled therewith for mounting on a printed circuit board (30) and for being electrically connected to conducting paths thereon, and an external terminal portion (56, 59, 82, 92) electrically coupled therewith for directly connecting said relay to a load (36) to be controlled external of and bypassing any conducting paths on said printed circuit board (30), and wherein said relay further includes a board-mounted common terminal portion (28, 29) for mounting on said printed circuit board (30) and for being electrically connected to conducting paths thereon and an external common terminal portion (62) for directly connecting said relay to said load (36) external of and bypassing any conducting paths on said printed circuit board (30).

17. A relay as recited in claim 16 wherein said first and second stationary contact members (51, 58, 81, 91) each further include a pin portion (63, 64) (30) for attaching said relay to said printed circuit board for additionally supporting said relay on said printed circuit board (30).

18. A relay as recited in claim 17 wherein said external terminal portions (56, 59, 82, 92) of said first and second stationary contact members (51, 58, 81, 91) and said external common terminal portion (62) all comprise quick-connect couplers.

19. An assembly including a printed circuit board, a relay mounted on said printed circuit board and a load to be controlled by said relay, characterized in that said relay includes a plurality of terminals, each of said plurality of terminals including a terminal portion (26, 27, 28, 29) mounted to said printed circuit board (30) and electrically connected to conducting paths on said printed circuit board (30), and a terminal portion (56, 59, 62, 82, 92) for connecting said terminals to a load external of and bypassing any conducting paths on said printed circuit board (30), and means (37, 38, 39) for connecting said external terminal portions to said load (36) external of any conducting paths on said printed circuit board (30).

20. An assembly as recited in claim 19 wherein said external terminal portions (56, 59, 62, 82, 92) comprise quick-connect couplers.

21. A method for mounting and using a relay that is mounted on a printed circuit board, characterized in that said method includes the steps of electrically coupling movable and stationary contacts (19, 21, 22) of said relay to conducting paths on said printed circuit board (30) and electrically coupling said movable and stationary contacts (19, 21, 22) of said relay to a load (36) to be controlled by said relay external of and bypassing any conducting paths on said printed circuit board (30).

22. A relay adapted to be mounted to a printed circuit board, said relay including a plurality of contacts (19, 21, 22) adapted to be electrically connected to a load, characterized in that said relay further includes a first terminal means (56, 59, 62, 82, 92) for electrically connecting said contacts (19, 21, 22) to a load (36) external of and bypassing any conducting paths on said printed circuit board (30), and second terminal means (26, 27, 28, 29) for mounting said relay to said printed circuit board (30) and for electrically connecting said contacts (19, 21, 22) to conducting paths on said printed circuit board (30).

23. A relay as recited in claim 22 wherein said first terminal means (56, 59, 62, 82, 92) comprise quick-connect couplers.

* * * * *